US010720720B2

(12) United States Patent
Wilmer et al.

(10) Patent No.: US 10,720,720 B2
(45) Date of Patent: Jul. 21, 2020

(54) SYSTEM OF STACKING ELECTRONIC MODULES ON A BASE BOARD

(71) Applicant: Visteon Global Technologies, Inc., Van Buren Township, MI (US)

(72) Inventors: Thorsten Wilmer, Bruchsal (DE); Thomas Kopfstedt, Karlsruhe (DE); Kai Wang, Ettlingen (DE)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 16/358,184

(22) Filed: Mar. 19, 2019

(65) Prior Publication Data

US 2019/0288423 A1 Sep. 19, 2019

Related U.S. Application Data

(60) Provisional application No. 62/644,770, filed on Mar. 19, 2018.

(51) Int. Cl.
| | |
|---|---|
| *H01R 12/00* | (2006.01) |
| *H01R 12/73* | (2011.01) |
| *H05K 1/18* | (2006.01) |
| *H05K 1/11* | (2006.01) |
| *H05K 1/14* | (2006.01) |

(52) U.S. Cl.
CPC ............. *H01R 12/73* (2013.01); *H05K 1/11* (2013.01); *H05K 1/141* (2013.01); *H05K 1/181* (2013.01); *H05K 2201/044* (2013.01)

(58) Field of Classification Search
CPC .......... H01R 12/73; H05K 1/11; H05K 1/141; H05K 1/181; H05K 2201/044

USPC .......................................................... 439/75
See application file for complete search history.

(56) References Cited

U.S. PATENT DOCUMENTS

| | | | | |
|---|---|---|---|---|
| 2,748,321 A * | 5/1956 | Kamm | ................. | H01R 12/714 361/733 |
| 6,906,415 B2 * | 6/2005 | Jiang | ................... | H01L 23/3128 257/723 |
| 7,417,322 B2 * | 8/2008 | Kang | .................... | H01L 25/105 257/777 |
| 7,786,563 B1 * | 8/2010 | Hoang | .................... | H01L 23/13 257/686 |
| 8,049,319 B2 * | 11/2011 | Ju | ......................... | H01L 23/552 257/685 |

(Continued)

*Primary Examiner* — Abdullah A Riyami
*Assistant Examiner* — Vladimir Imas
(74) *Attorney, Agent, or Firm* — Dickinson Wright PLLC

(57) ABSTRACT

Various systems may benefit from suitable arrangements and configurations of modules. For example, certain electronics systems may benefit from systems and methods for stacking electronic modules on a base board. A system of stacking computer modules can include a base board, which can be a printed circuit board (PCB). The system can also include a first plurality of connectors, mounted to and in electrical communication with the base board. The system can further include a first module, the first module including a second PCB and a second plurality of bottom connectors configured to engage the first plurality of connectors and a third plurality of top connectors. The system can additionally include a second module, the second module including a third PCB and a fourth plurality of bottom connectors configured to engage the third plurality of top connectors of the first module.

20 Claims, 4 Drawing Sheets

(56) References Cited

U.S. PATENT DOCUMENTS

| | | | |
|---|---|---|---|
| 9,064,715 B2* | 6/2015 | Lee .................. | H01L 25/0655 |
| 9,232,651 B2* | 1/2016 | Ware .................. | G11C 11/4093 |
| 9,402,315 B2* | 7/2016 | Chun .................. | H05K 1/18 |
| 9,414,493 B2* | 8/2016 | Doering .............. | H01R 12/52 |
| 9,554,484 B2* | 1/2017 | Rogers ................ | A61B 5/01 |
| 9,655,241 B2* | 5/2017 | Ishida ................. | H01R 12/88 |
| 9,699,896 B2* | 7/2017 | Takahashi ........... | H05K 1/029 |
| 9,763,343 B2* | 9/2017 | Kim .................... | H05K 5/0047 |
| 9,832,874 B2* | 11/2017 | Doering .............. | H01R 12/52 |
| 10,015,916 B1* | 7/2018 | Karp ................... | H05K 3/341 |
| 10,159,144 B2* | 12/2018 | Kariyazaki .......... | H01L 23/32 |
| 10,187,996 B2* | 1/2019 | Swaminathan ..... | H05K 1/141 |
| 10,342,132 B2* | 7/2019 | Li ....................... | H01R 12/7076 |
| 10,420,218 B2* | 9/2019 | Riou ................... | H05K 5/06 |
| 2001/0048591 A1* | 12/2001 | Fjelstad .............. | H01L 23/49816 |
| | | | 361/767 |
| 2003/0165051 A1* | 9/2003 | Kledzik .............. | H01L 25/0652 |
| | | | 361/760 |
| 2006/0077644 A1* | 4/2006 | Nickerson .......... | H01L 23/5387 |
| | | | 361/767 |

* cited by examiner

SYSTEM OF STACKING ELECTRONIC MODULES ON A BASE BOARD

CROSS-REFERENCE TO RELATED APPLICATION

This application is related as a non-provisional to and claims the benefit and priority of U.S. Provisional Patent Application No. 62/644,770, filed Mar. 19, 2018, the entirety of which is hereby incorporated herein by reference.

FIELD

Various systems may benefit from suitable arrangements and configurations of modules. For example, certain electronics systems may benefit from systems and methods for stacking electronic modules on a base board.

RELATED ART

Certain computer components, such as modules or systems on a chip ("SoCs") are installed on a back plane or base board, which is typically a printed circuit board (PCB). In this arrangement, each SoC with its own layer (hereinafter referred to as a "module") is attached to the baseboard via a connector, resulting in multiple modules each connected to and perpendicular with the base board. By reserving a portion of the base board for each module, there is little room remaining for additional uses of the valuable base board space.

Because the modules are electrically the same, the connections to the base board are also the same, resulting in a base board with a plurality of identical connectors to receive identical modules, while the portions of the base board under the modules are left unused and wasted. An example arrangement is shown in FIG. 1. A base board 12 is configured with a number of layers 18$n$, each containing a SoC 16$n$, forming modules 20$n$. As a result of this arrangement, there is no room on base board 12 for other modules 20$n$.

SUMMARY

One aspect of certain embodiments relates to system of stacking modules. The system may include a base board, wherein the base board is printed circuit board (PCB), a first plurality of connectors, mounted to and in electrical communication with the base board, a first module, the first module including a second PCB and a second plurality of bottom connectors configured to engage the first plurality of connectors and a third plurality of top connectors, and a second module, the second module including a third PCB and a fourth plurality of bottom connectors configured to engage the third plurality of top connectors of the first module.

The system may also include a system on a chip (SoC) electrically connected to the first module.

The system may also include pairs of pins electrically connecting the SoC to the second PCB shift to an adjacent first of the second plurality of bottom connectors.

The system may also include pins electrically connecting a first of the third plurality of top connectors shifted to an adjacent second of the second plurality of bottom connectors.

The system may also include pins electrically connecting a second SoC to the third PCB shifted to an adjacent first of the fourth plurality of connectors.

The system may also include a second SoC electrically connected to the second module.

The system may also include a shift further comprising an offset by one pair of pins of the SoC and the first of the second plurality of bottom connectors.

The system may also include a shift further comprising an offset by one pair of pins of the first of the third plurality of top connectors and the second of the second plurality of bottom connectors.

The system may also include a shift with an additional connector configured to offset the pins by one pair of pins.

The system may also include a shift with an additional connector configured to offset the pins by one pair of pins.

The system may also include only a portion of the pairs of pins electrically connecting the SoC to the second PCB shift to an adjacent first of the second plurality of bottom connectors.

The system may also include a portion of the pairs of pins electrically connecting the SoC to the second PCB shift to an adjacent first of the second plurality of bottom connectors.

BRIEF DESCRIPTION OF THE DRAWINGS

These and other features and advantages of the present invention will be readily appreciated, as the same becomes better understood by reference to the following detailed description when considered in connection with the accompanying drawings wherein.

DETAILED DESCRIPTION

Figure 1:
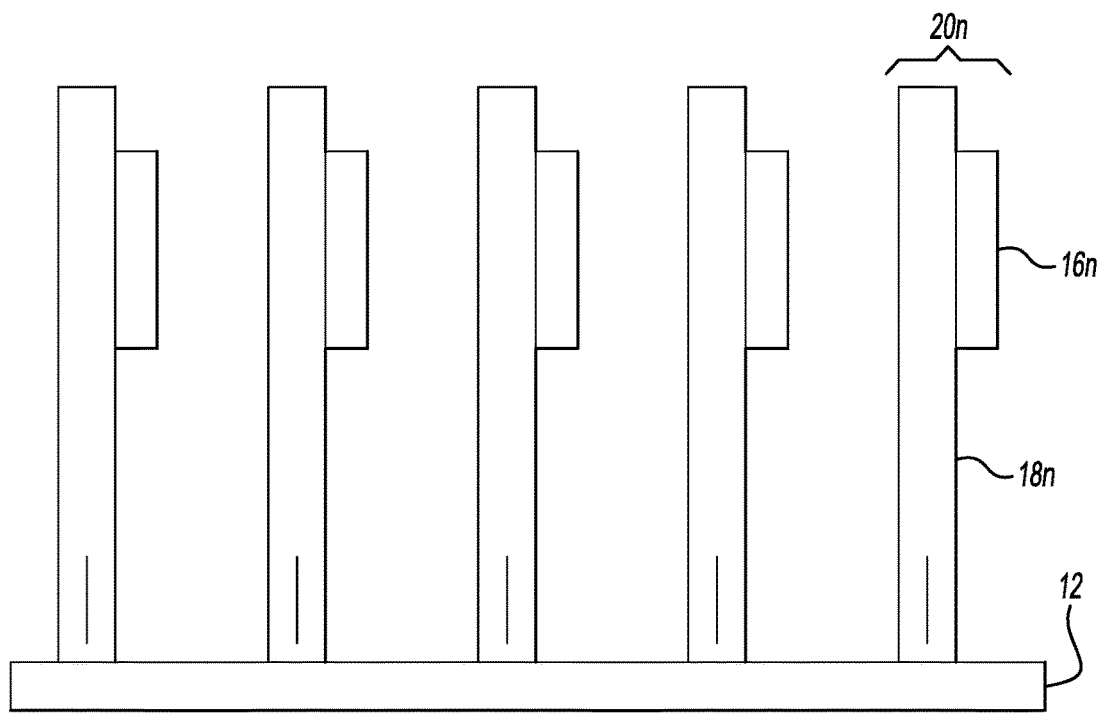
FIG. 1 is a block diagram of a traditional arrangement of unstacked modules installed on a base board.
Figure 2A:
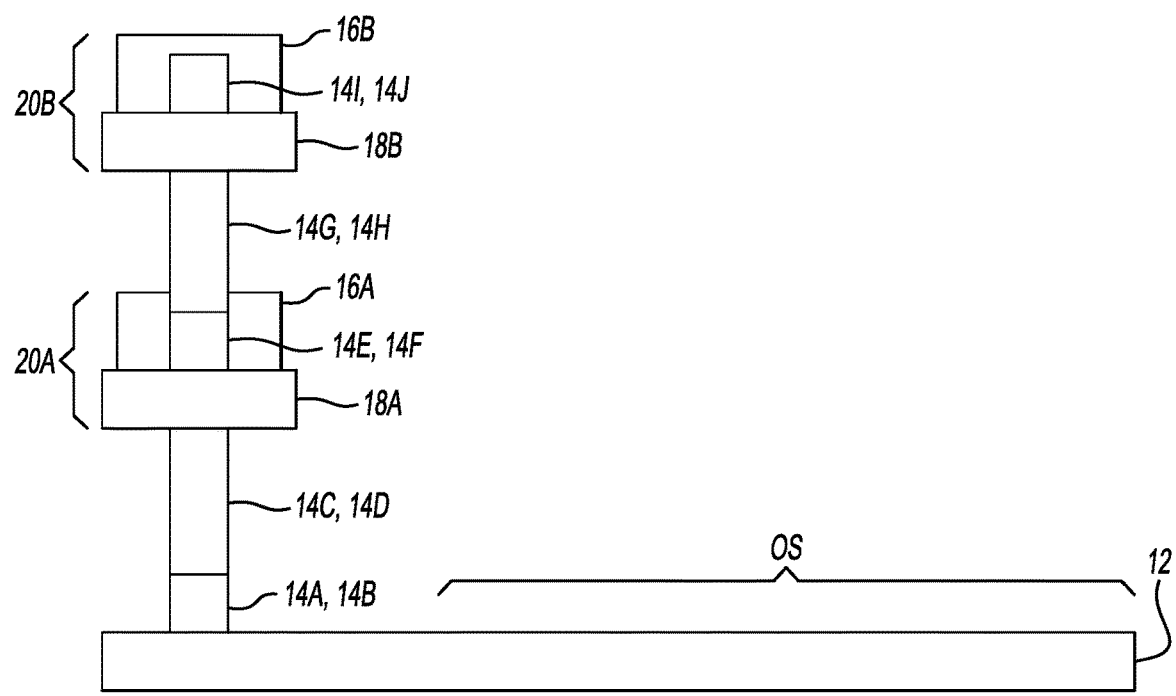
FIGS. 2A-2B are front and side view block diagrams of a first exemplary embodiment of two of stacked modules installed on a base board.
Figure 2B:
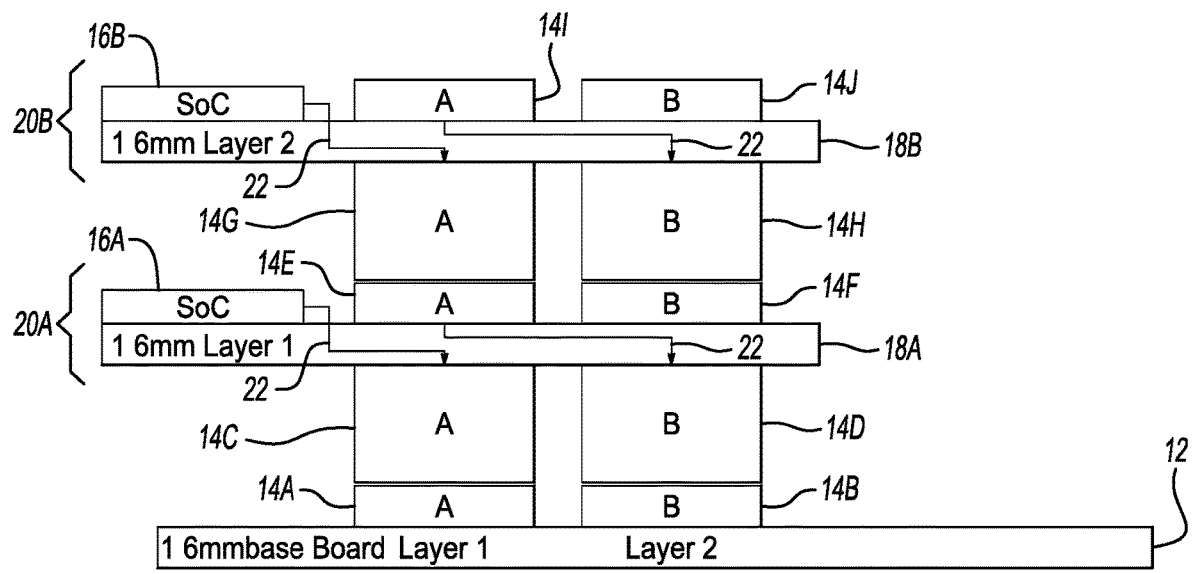

By stacking modules vertically and shifting the pins connecting the stacked modules such that operability is maintained (as shown in FIGS. 2A-2B) additional space on the base board may be utilized for other components, or a smaller base board may be used. As disclosed herein, a system of stacking modules on a base board is provided. The stacked modules can be joined using connectors and/or printed circuit boards (PCBs) that can be configured via shifting pins to maintain the electrical connections as if the modules were installed traditionally (i.e., side-by-side), on the base board.

A first stacked module system 10 is shown in FIGS. 2A-2B. The first stacked module system 10 may include a PCB back plane or base board 12 with a connector 14A assigned to layer 18A and a connector 14B assigned to layer 18B. The term "connector", as used herein, can refer to an electrical connector—a device that can be used to join electrical terminals and form an electric circuit. The connector may include a first type (for example a male end) and a second type (for example a female end) that are configured to be joined together temporarily, semi-permanently, or permanently. The connector may be configured with a single arrangement to prevent improper connections. The connector may be configured to utilize an adapter to join with an incompatible connector.

Connectors 14A, 14B may be configured to receive a second pair of connectors 14C, 14D.

Layer 18A may include connectors 14C, 14D located on the bottom side of layer 18A, facing base board 12. Connectors 14C, 14D may be configured to engage connectors 14A, 14B, respectively, of base board 12. Layer 18A may also include a system on a chip (SoC) 16A and connectors 14E, 14F mounted on the top side of layer 18A. The system on a chip may include a processor, memory, or the like. The system on a chip may be configured to perform a specific task, such as vehicle navigation, fuel economy, infotainment tasks, vehicle security, or any other desired tasks.

Connectors 14C-14F, SoC 16A, and layer 18A may be defined as a module 20A. The term "module" as used herein, can refer to an electrical component that may include any or all of the following: one or more connectors, SoCs, and/or connectors. Layer 18A may include a pin arrangement such that the pins are offset, or shifted, one level. As shown in FIGS. 2A-2B, the pins assigned to SoC 16A are shifted to the right, over connector 14C (and under connector 14E) within layer 18A. Similarly, the pins assigned to connector 14E are shifted to the right, over connector 14D (and under connector 14F) within layer 18A. The pins mentioned herein can be provided by traces, vias, and other conductive arrangements that are not limited to a particular shape. For example, a female pin can be shaped like a cup, although any other shape is also permitted.

Layer 18B may include connectors 14G, 14H located on the bottom side of layer 18B, facing base board 12. Connectors 14G, 14H may be configured to engage connectors 14E, 14F, respectively, of layer 18A. Layer 18B may also include SoC 16B and connectors 14I, 14J mounted on the top side of layer 18B. Connectors 14G-14H, SoC 16B, and layer 18B may be defined as a module 20B. Layer 18B may include a pin arrangement such that the pins are offset, or shifted, one level. As shown in FIG. 2B, the pins assigned to SoC 16B are shifted to the right, over connector 14G (and under connector 14I) within layer 18B. Similarly, the pins assigned to connector 14I are shifted to the right, over connector 14H (and under connector 14J) within layer 18B.

By stacking modules 20A and 20B on top of one another, space of base board 12 is conserved, as is shown in FIG. 2A. The open space ("OS") on base board 12 may be utilized for other purposes, if necessary. Alternatively, a smaller base board 12 may be used, allowing for tighter packaging of base board 12 and modules 20A, 20B.

The stacking of modules 20A, 20B on base board 12 can be accomplished by shifting the path of signals 22 by shifting the corresponding pins carrying those signals within the connectors and/or within layers 18A, 18B. A number of configurations of pin shifting may be implemented, as shown in FIGS. 2B-5.

A first pin shift configuration can be to shift all of the pins within layers 18A, 18B of modules 20A, 20B one layer to the back. For example, the first pair of pins of SoC 16A is shifted within layer 18A of module 20A to the second pair of pins of connector 14C. This process (described in detail below) can be continued for all of the pin pairs of SoC 16A, until the last pin pair of SoC 16A is reached. That pin pair is assigned to the first pin pair of connector 14C.

The process can be duplicated for connector 14E with respect to connector 14D within layer 18A. The first pair of pins of connector 14E is shifted within layer 18A to the second pair of pins of connector 14D. This process can be continued for all of the pin pairs of SoC 16A, until the last pin pair of SoC 16A is reached. That pair of pins can be assigned to the first pin pair of connector 14D.

Next, stacking module 20B on top of module 20A, the first pair of pins of SoC 16B is shifted within layer 18B of module 20B to the second pair of pins of connector 14G. This process is continued for all of the pin pairs of SoC 16B, until the last pin pair of SoC 16B is reached. That pin pair is assigned to the first pin pair of connector 14G.

The process is duplicated for connector 14I with respect to connector 14H within layer 18B. The first pair of pins of connector 14I is shifted within layer 18B to the second pair of pins of connector 14H. This process is continued for all of the pin pairs of connector 14I, until the last pin pair of connector 14I is reached. That pin pair can be assigned to the first pin pair of connector 14H.

A second pin shift configuration can be to shift all of the pins within layers 18A, 18B of modules 20A, 20B one layer to the front. For example, the first pair of pins of SoC 16A can be shifted within layer 18A of module 20A to the last pair of pins of connector 14C. This process (described in detail below) can be continued for all of the pin pairs of SoC 16A, until the last pin pair of SoC 16A is reached. That pin pair can be assigned to the second-to-last pin pair of connector 14C.

The process can be duplicated for connector 14E with respect to connector 14D within layer 18A. The first pair of pins of connector 14E can be shifted within layer 18A to the last pair of pins of connector 14D. This process can be continued for all of the pin pairs of SoC 16A, until the last pin pair of SoC 16A is reached. That pin pair can be assigned to the second-to-last pin pair of connector 14D.

Next, stacking module 20B on top of module 20A, the first pair of pins of SoC 16B can be shifted within layer 18B of module 20B to the last pair of pins of connector 14G. This process can be continued for all of the pin pairs of SoC 16B, until the last pin pair of SoC 16B is reached. That pin pair can be assigned to the second-to-last pin pair of connector 14G.

The process can be duplicated for connector 14I with respect to connector 14H within layer 18B. The first pair of pins of connector 14I can be shifted within layer 18B to the last pair of pins of connector 14H. This process can be continued for all of the pin pairs of connector 14I, until the last pin pair of connector 14I is reached. That pin pair can be assigned to the second-to-last pin pair of connector 14H.

Other pin shifting configurations may include shifting pins in smaller groups, or individual pins.

The pin shifting can made by using a separate connector configured to shift pin configurations (as opposed to a straight-through connector). For example, connectors 14A-14J can be configured to shift pins as described herein. Alternatively, layers 18A, 18B can be configured to shift pin configurations within the PCBs of layers 18A, 18B. Pin shifting may be configured within a separate row or column of pins within connectors 14A-14J.

Figure 3:
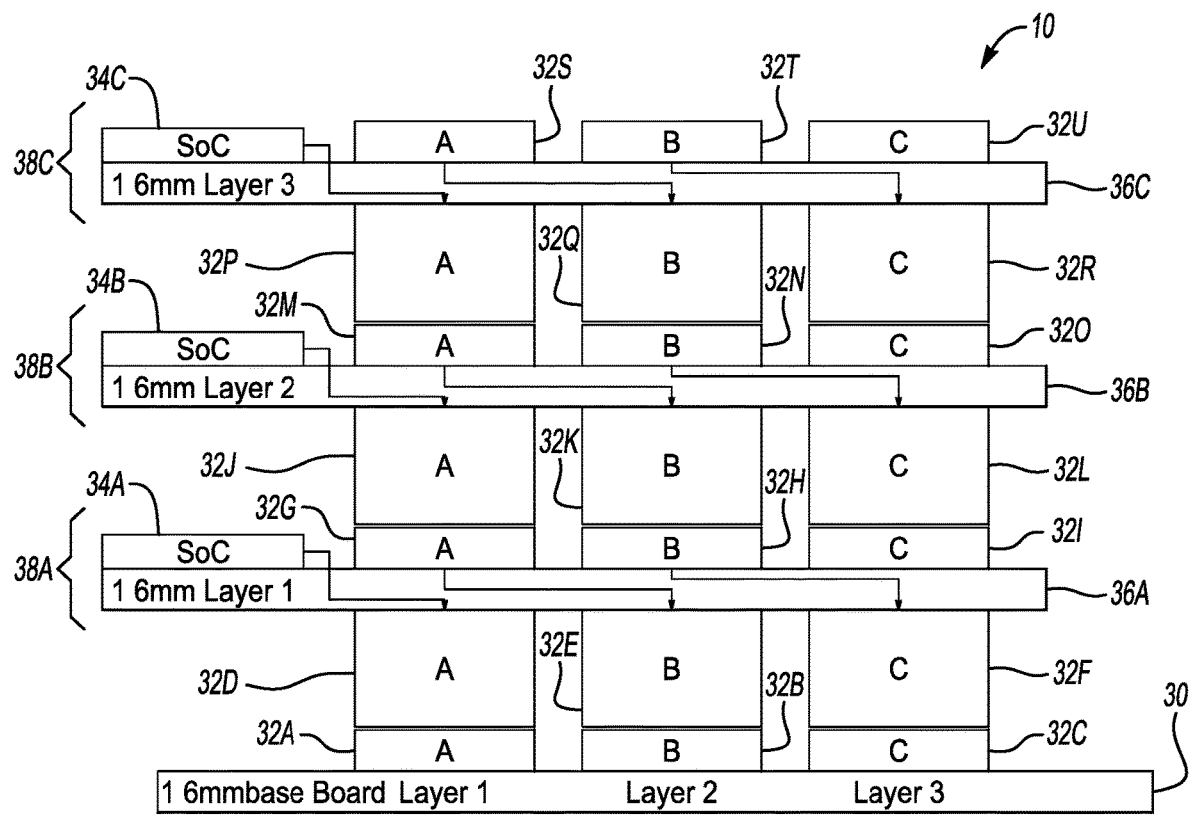
FIG. 3 is a block diagram of a second exemplary embodiment of three stacked modules installed on a base board.

Referring now to FIG. 3, a second stacked module system 10 is shown. The second stacked module system 10 may include a base board 30 with a connector 32A assigned to layer 36A, a connector 32B assigned to layer 36B, and connector 32C assigned to layer 36C. Connector 32A may be configured to receive a connector 32D, connector 32B may be configured to receive a connector 32E, and connector 32C may be configured to receive a connector 32F.

Layer 36A may include connectors 32D-32F located on the bottom side of layer 36A, facing base board 30. Connectors 32D-32F may be configured to engage connectors 32A-32C, respectively, of base board 30. Layer 36A may also include an SoC 34A and connectors 32G-32I mounted on the top side of layer 36A. Connectors 32D-32I, SoC 34A, and layer 36A may be defined as a module 38A. Layer 36A may include a pin arrangement such that the pins are offset, or shifted, one level. As shown in FIG. 3, the pins assigned to SoC 34A can be shifted to the right, over connector 32D (and under connector 32G) within layer 34A. Similarly, the pins assigned to connector 32G can be shifted to the right, over connector 32E (and under connector 32H) within layer 34A and the pins assigned to connector 32H are shifted to the right, over connector 32F (and under connector 32I) within layer 34A.

Layer 36B may include connectors 32J-32L located on the bottom side of layer 36B, facing base board 30. Connectors 32J-32L may be configured to engage connectors 32G-32I, respectively, of layer 36A. Layer 36B may also include SoC 34B and connectors 32M-32O mounted on the top side of layer 34B. Connectors 32J-32L, SoC 34B, connectors 32M-32O and layer 36B may be defined as a module 38B. Layer 36B may include a pin arrangement such that the pins are offset, or shifted, one level. As shown in FIG. 3, the pins assigned to SoC 34B can be shifted to the right, over connector 32J (and under connector 32M) within layer 36B. Similarly, the pins assigned to connector 32M can be shifted to the right, over connector 32K (and under connector 32N) and the pins assigned to connector 32N can be shifted to the right, over connector 32L (and under connector 32O) within layer 36B.

Layer 36C may include connectors 32P-32R located on the bottom side of layer 36C, facing base board 30. Connectors 32P-32R may be configured to engage connectors 32M-32O, respectively, of layer 36B. Layer 36C may also include SoC 34C and connectors 32S-32U mounted on the top side of layer 36C. Connectors 32P-32R, SoC 34C, connectors 32S-32U and layer 36C may be defined as a module 38C. Layer 36C may include a pin arrangement such that the pins are offset, or shifted, one level. As shown in FIG. 3, the pins assigned to SoC 34C can be shifted to the right, over connector 32P (and under connector 32S) within layer 36C. Similarly, the pins assigned to connector 32S can be shifted to the right, over connector 32Q (and under connector 32T) and the pins assigned to connector 32T can be shifted to the right, over connector 32R (and under connector 32U) within layer 36C. It should be understood that the stacked module systems 10 described herein are only examples, and not limiting.

Figure 4:
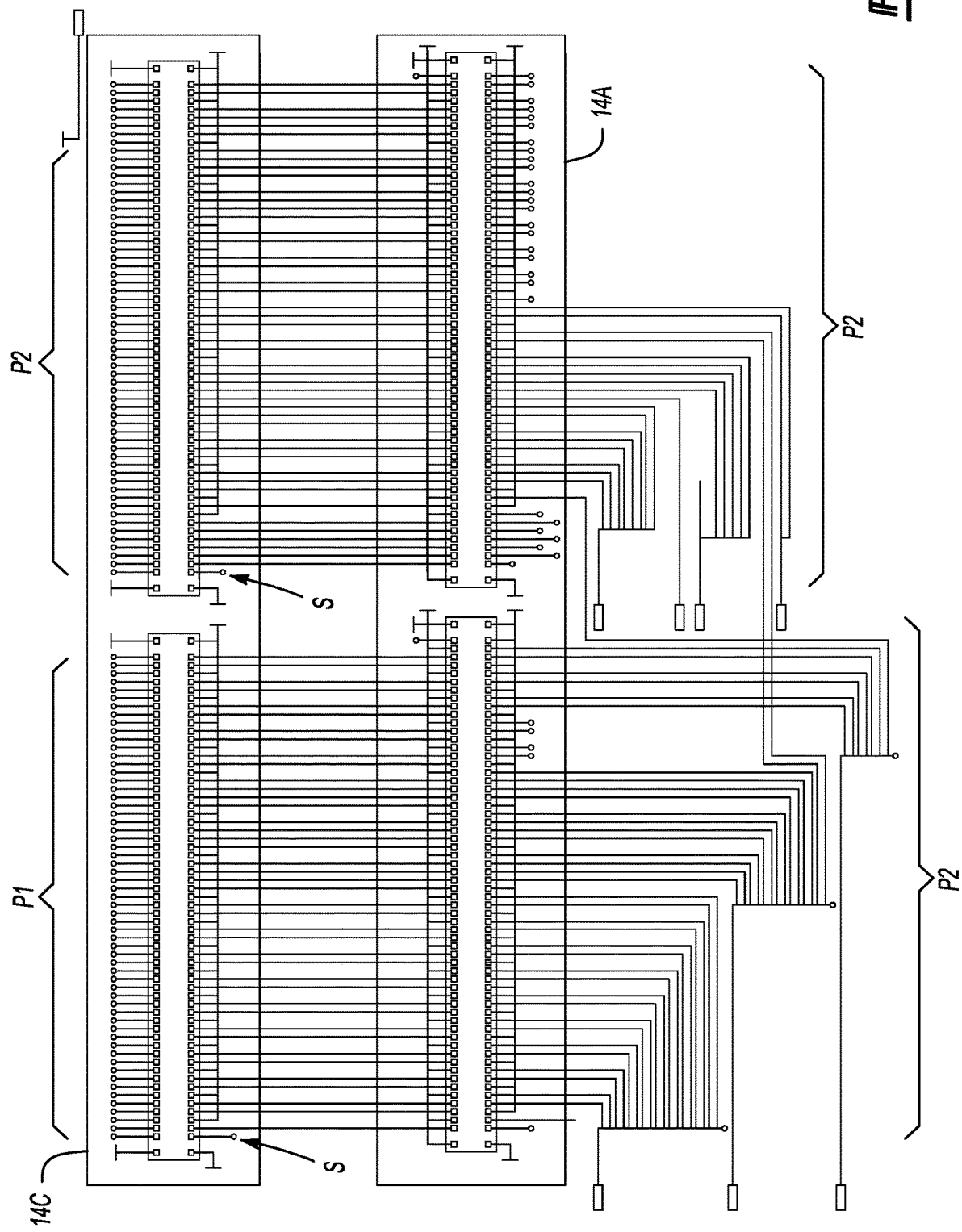
FIG. 4 is a first connector diagram detailing the pins of connectors used to stack the modules and connect to the base board according to an exemplary embodiment.
Figure 5:
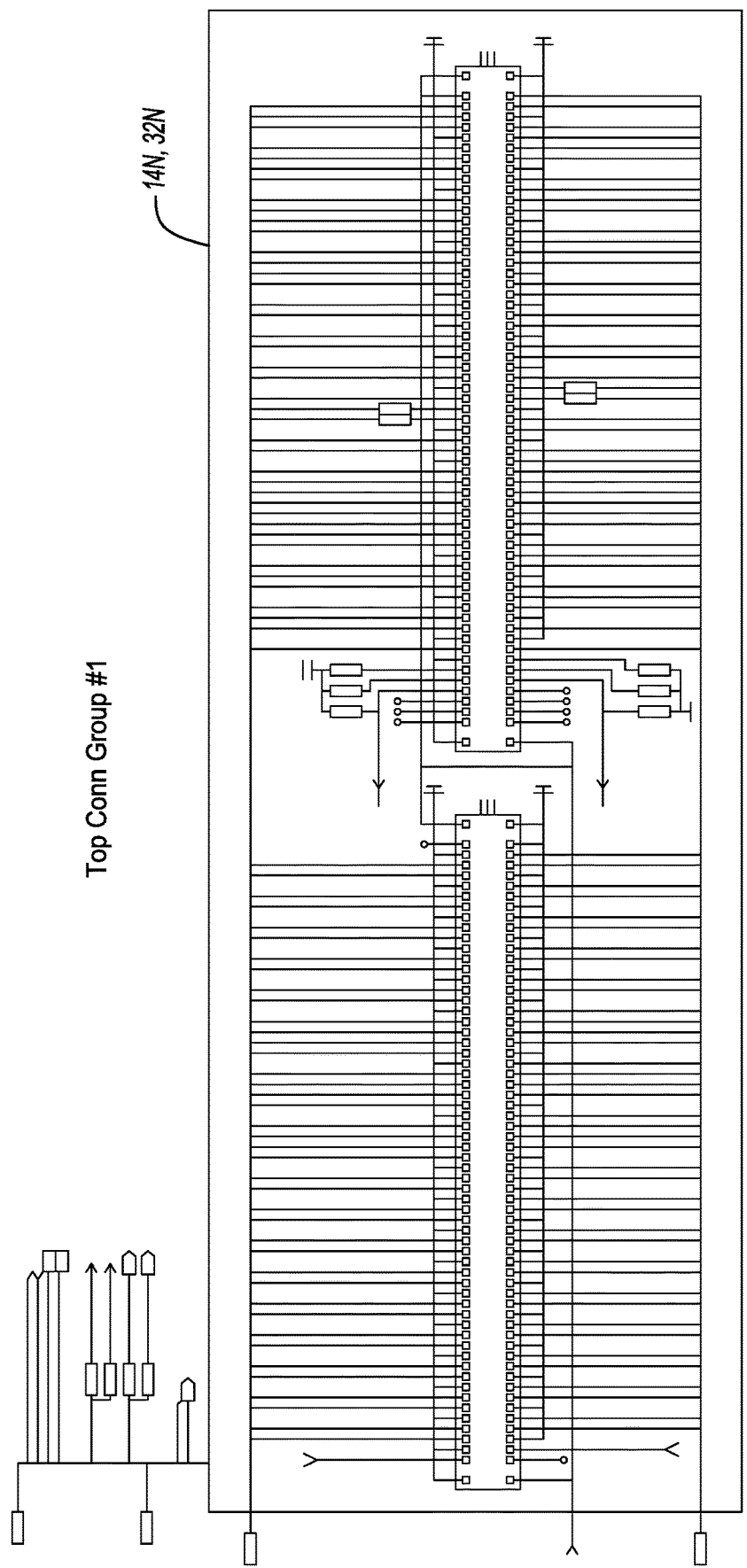
FIG. 5 is a second connector diagram detailing the pins of connectors used to stack the modules and connect to the base board according to another exemplary embodiment.

Referring now to FIG. 4, connectors 14A, 14C are shown divided into two sets of pins P1, P2. The shifting of pins are described herein is also provided in FIG. 4. Pin shift S is shown on the first and second set of pins of connector 14A with respect to the first set of pins of connector 14C. In other words, the first set of pins on connector 14A can engage the second set of pins of connector 14C for each of pin sets P1, P2. Because some of the pins of connectors 14A, 14C may not be used, pin shift S may not create a shortage of pins at the end of pin sets P1, P2. Thus, the signals passing through connector 14C (from module 20A) can enter connector 14A and base board 10 without loss of signal integrity.

Certain embodiments may be directed to a system of stacking modules. The system can include a base board. The base board can be a printed circuit board (PCB). The system can also include a first plurality of connectors mounted to and in electrical communication with the base board. The system can further include a first module comprising a second PCB. The first module can include a second plurality of bottom connectors configured to engage the first plurality of connectors. The second module can also include a third plurality of top connectors. The top connectors of the first module can replicate the interface of the base board, such that a module exactly like the first module can be mounted on top of the first module in just the same way that the first module is mounted on the baseboard. The third plurality of top connectors can be both electrically and mechanically like the first plurality of connectors. Optionally, while all of the first plurality of connectors may be electrically active, at least one set of the third plurality of top connectors may be electrically connected differently. This different electrical connectivity may mean that the set is not electrically connected at all, or that the set is electrically connected to a bus, such as a data bus, power bus, or ground. As a further option, the different electrical connectivity can be that the set provides for communication from a chip on the first module to a chip in a module stacked above the chip.

The system can also include a second module that includes a third PCB and that includes a fourth plurality of bottom connectors configured to engage the third plurality of top connectors of the first module. This module can be exactly like the first module in terms of all mechanical and electrical interfaces.

Examples of these arrangements can be seen in FIGS. 2A, 2B, and 3. In the arrangement shown in FIG. 3, there are three stacked modules on top of the baseboard and three sets of interfaces. Nevertheless, this principle can be extended to include much larger numbers of stackable modules.

The first plurality of connectors can include a first connector and a second connector spaced apart from the first connector. This spacing apart can be accomplished by having multiple connectors spaced at regular intervals. For example, pairs of pins can be separated from adjacent pairs of pins by a regular amount of distance, wherein the distance can be selected to reduce cross-talk or other interference. Optionally, shielding can be provided between the pairs of pins.

The second plurality of bottom connectors can include a third connector configured to be connected to the first connector and can include a fourth connector configured to be connected to the second connector.

The first module can further include a first system on a chip (SoC). The first SoC can be electrically connected to the base board through the third connector. The third plurality of top connectors can include a fifth connector positioned directly over the third connector on an opposite side of the second PCB from the third connector and can include a sixth connector positioned directly over the fourth connector on the opposite side of the second PCB. Although in certain embodiments the top connectors are positioned directly over the bottom connectors, in certain embodiments the top connectors can be offset with respect to the bottom connectors. This offset may make it easier to connect pins of the top connector to the appropriate pins of the bottom connector. On the other hand, such an offset may cause the stack of modules to shift in the offset direction as more modules are added, and may require a larger reserved volume above the baseboard. Another option is to have the top connectors rotated at a predetermined number of degrees from the bottom connectors in plan view. In this way, as the modules are stacked the orientation of adjacent modules may differ from the module below and above. This may also require a larger reserved volume above the baseboard. The connectors are illustrated as arranged linearly in the figures, but could be arranged in a series of lines or in a curve, such as a circle or semicircle.

If a closed shape arrangement is used, it may be possible to provide the offset while not increasing the reserved volume. The mechanical shape of the connector may be used to ensure that a proper rotation of the circle or other closed shape arrangement occurs at each level of the stack. Thus, for example, a first module may be stacked directly on the baseboard. A second module may be stacked at a ninety degree shift on top of the first module. A third module may be stacked at a ninety degree shift on top of the second module. A fourth module may be stacked at a ninety degree shift on top of the third module. If square modules are used, this may permit an efficient use of space for the four modules.

The fifth connector and the sixth connector described above can be configured to provide electric connection to the base board through the fourth connector. Optionally, the sixth connector may not be electrically connected to the baseboard.

The fourth plurality of bottom connectors can include a seventh connector configured to connect to the fifth connector and can include an eighth connector configured to connect to the sixth connector.

The second module can further include a second system on a chip (SoC). This can be the same kind of SoC as the first SoC. Optionally, this can be a complementary SoC. Thus, for example, the first SoC may be designed to handle navigation tasks of a vehicle, while the second SoC may be designed to handle engine control tasks of a vehicle.

The second SoC can be electrically connected to the base board through the third connector. The second module can further include a fifth plurality of top connectors. The fifth plurality of top connectors can include a ninth connector positioned directly over the seventh connector on an opposite side of the third PCB from the seventh connector. The fifth plurality of top connectors can include a tenth connector positioned directly over the eighth connector on the opposite side of the third PCB. As mentioned above, there are also other possible configurations.

The ninth connector and the tenth connector can be configured to provide electric connection to the base board through the eighth connector.

In certain embodiments, the first module can include a first SoC and the second module can include a second SoC. Each of these modules can include an integer number (N) of pairs of pins at bottom interfaces thereof. A first bottom interface of the first module can include the second plurality of bottom connectors described above and a second bottom interface of the second module can include the fourth plurality of bottom connectors described above.

Each of these modules can include an integer number (M) of pairs of pins at top interfaces thereof, such that M is less than N (for example, M can be N−1.

Each pair of pins from the top interfaces can be connected to a shifted adjacent pair of pains at the bottom interfaces. This shifting can take place on or within the PCB (as illustrated in FIGS. 2A, 2B, and 3) or can take place by introducing a mechanical offset between the top and bottom interfaces, as mentioned above.

The first module can be configured to be interchangeable with the second module. The system can also include, as illustrated in FIG. 3, a third module attached to a top of the second module. The third module can be configured to be interchangeable with the first module and can be configured to be interchangeable with the second module.

The first module can include a first group of connectors for a first SoC on the first module and an integer number (P) of groups of connectors for SoCs on other like modules.

Connectors for an adjacently stacked SoC can be arranged next to connectors for the first SoC within the second plurality of bottom connectors. Thus, as illustrated in FIG. 3, for example, the connectors for SoC 34A can be adjacent to the connectors for SoC 34B, which in turn can be adjacent to the connectors for SoC 34C.

The above-described system of stacking modules can be implemented in a variety of different contexts. For example, the stacked modules can be used for providing prototypes of systems that involve multiple processors of the same type operating in parallel, or systems that involve multiple processors of different types working in harmony. In certain embodiments, the base board may be provided (together with the boards mounted thereon) as an electronic control unit (ECU) in a vehicle. For example, the ECU may be an infotainment system, a navigation system, an engine control unit, a security system, or any other desired unit of a vehicle. In certain embodiments, a single base board may have multiple mounting points where stacks of modules can be arranged.

Certain embodiments may have various benefits and/or advantages. For example, certain embodiments may permit automotive systems to have scalable designs, particularly in the electronics areas. The architectures laid out in the figures and described above may be scalable and may permit mixing and matching. Thus, a demonstration or prototype may be able to be provided more readily. Instead of having to create an entire device from the ground/board up, an add-on to a foundational board can be provided.

Certain embodiments may also allow a faster proof of concept of upgrade ideas. For example, while a final version of a product may be delivered as a single base board to improve resistance to vibration and other environmental factors, a demonstration unit may be delivered as a legacy base board with additional modules stacked thereon. Furthermore, in certain embodiments a vehicle upgrade may be permitted by introducing a module on top of the existing base board using the connectors described herein. Thus, in certain embodiments, an upgradeable package can be provided that has low complexity of installation and that is scalable.

Additionally, certain embodiments can permit a tester to rapidly test multiple scaled versions of a desired system. For example, a complete stack of modules on the baseboard can be tested, a module can be removed from the stack and the stack can be retested. Likewise, a different module could be added to the stack or could replace one of the modules of the stack and new testing could be performed. In this way, testing can be rapidly performed on a variety of different arrangements, while permitting a small number of modules to be fabricated and provided to testing. Other benefits and advantages may accrue, and it is not necessary for any or all of these advantages or benefits to be present.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed.

What is claimed is:

1. A system of stacking modules, comprising:
    a base board, wherein the base board comprises a printed circuit board (PCB);

a first plurality of connectors mounted to and in electrical communication with the base board;

a first module comprising a second PCB and a first layer, the first layer comprising a second plurality of bottom connectors disposed on the first layer facing the base board and configured to engage the first plurality of connectors, and comprising a third plurality of top connectors, disposed on a side of the first layer opposite the second plurality of bottom connectors; and a second module comprising a third PCB and a second layer, the second layer comprising a fourth plurality of bottom connectors disposed on the second layer facing the first module and configured to engage the third plurality of top connectors of the first module, wherein pins disposed on the first layer and the second layer are shifted to engage corresponding ones of the first plurality of connectors and the third plurality of the top connectors.

2. The system of claim 1, wherein the first plurality of connectors comprises a first connector and a second connector spaced apart from the first connector.

3. The system of claim 2, wherein the second plurality of bottom connectors comprises a third connector configured to be connected to the first connector and comprises a fourth connector configured to be connected to the second connector.

4. The system of claim 3, wherein the first module further comprises a first system on a chip (SoC).

5. The system of claim 4, wherein the first SoC is electrically connected to the base board through the third connector.

6. The system of claim 3, wherein the third plurality of top connectors comprises a fifth connector positioned directly over the third connector on an opposite side of the second PCB from the third connector and comprises a sixth connector positioned directly over the fourth connector on the opposite side of the second PCB.

7. The system of claim 6, wherein the fifth connector and the sixth connector are configured to provide electric connection to the base board through the fourth connector.

8. The system of claim 6, wherein the fourth plurality of bottom connectors comprises a seventh connector configured to connect to the fifth connector and comprises an eighth connector configured to connect to the sixth connector.

9. The system of claim 7, wherein the second module further comprises a second system on a chip (SoC).

10. The system of claim 9, wherein the second SoC is electrically connected to the base board through the third connector.

11. The system of claim 8, wherein the second module further comprises a fifth plurality of top connectors, wherein the fifth plurality of top connectors comprises a ninth connector positioned directly over the seventh connector on an opposite side of the third PCB from the seventh connector, and wherein the fifth plurality of top connectors comprises a tenth connector positioned directly over the eighth connector on the opposite side of the third PCB.

12. The system of claim 11, wherein the ninth connector and the tenth connector are configured to provide electric connection to the base board through the eighth connector.

13. The system of claim 1, wherein the first module comprises a first SoC and the second module comprises a second SoC.

14. The system of claim 13, wherein each module of the first module and the second module comprises an integer number (N) of pairs of pins at bottom interfaces thereof, wherein a first bottom interface of the first module comprises the second plurality of bottom connectors and a second bottom interface of the second module comprises the fourth plurality of bottom connectors.

15. The system of claim 14, wherein each module of the first module and the second module comprises an integer number (M) of pairs of pins at top interfaces thereof, wherein M is less than N.

16. The system of claim 15, wherein each pair of pins from the top interfaces is connected to a shifted adjacent pair of pains at the bottom interfaces.

17. The system of claim 1, wherein the first module is configured to be interchangeable with the second module.

18. The system of claim 17, further comprising a third module attached to a top of the second module, wherein the third module is configured to be interchangeable with the first module and is configured to be interchangeable with the second module.

19. The system of claim 1, wherein the first module comprises a first group of connectors for a first SoC on the first module and an integer number (P) of groups of connectors for SoCs on other like modules.

20. The system of claim 19, wherein connectors for an adjacently stacked SoC are arranged next to connectors for the first SoC within the second plurality of bottom connectors.

* * * * *